United States Patent
Minezaki

(10) Patent No.: US 9,979,392 B2
(45) Date of Patent: May 22, 2018

(54) CAPACITIVE KEYBOARD

(71) Applicant: TOPRE CORPORATION, Tokyo (JP)

(72) Inventor: Shigeki Minezaki, Kanagawa (JP)

(73) Assignee: TOPRE CORPORATION (JP)

( * ) Notice: Subject to any disclaimer, the term of this patent is extended or adjusted under 35 U.S.C. 154(b) by 0 days. days.

(21) Appl. No.: 15/539,105

(22) PCT Filed: Nov. 27, 2015

(86) PCT No.: PCT/JP2015/084082
§ 371 (c)(1),
(2) Date: Jun. 22, 2017

(87) PCT Pub. No.: WO2016/104102
PCT Pub. Date: Jun. 30, 2016

(65) Prior Publication Data
US 2017/0346488 A1    Nov. 30, 2017

(30) Foreign Application Priority Data
Dec. 26, 2014    (JP) ................................. 2014-264871

(51) Int. Cl.
*H03K 17/94*    (2006.01)
*H03M 11/00*    (2006.01)
*H03K 17/98*    (2006.01)
*G06F 3/023*    (2006.01)
*H03M 11/20*    (2006.01)

(52) U.S. Cl.
CPC ............. *H03K 17/98* (2013.01); *G06F 3/023* (2013.01); *H03M 11/20* (2013.01)

(58) Field of Classification Search
CPC ......... H03K 17/98; H03M 11/20; G06F 3/023
USPC ........................................................ 341/26
See application file for complete search history.

(56) References Cited

FOREIGN PATENT DOCUMENTS

| JP | 57193830 A | 11/1982 |
| JP | 62144223 A | 6/1987 |
| JP | H09204846 A | 8/1997 |

(Continued)

OTHER PUBLICATIONS

PCT/JP2015/084082, International Search Report and Written Opinion and English translation, dated Apr. 5, 2016, 6 pages for original, 7 pages of English translation.

*Primary Examiner* — Tanmay Shah
(74) *Attorney, Agent, or Firm* — Kilpatrick Townsend & Stockton LLP

(57) ABSTRACT

A capacitive keyboard that can detect a key that has been depressed and the depressed amount thereof with high accuracy is provided. The capacitive keyboard includes a drive circuit 11 that alternatively switches the voltage of each of drive lines M from an L-level to an H-level, a sensing circuit 12 that is connected to each of sensing lines N and that selects one of the sensing lines N to detect the voltage generated in the selected sensing line, and a control circuit 15. The control circuit 15 includes a storage unit 44 including storage areas corresponding to keys, a storage control unit 42 that acquires the voltage generated in the sensing line and that stores the acquired voltage in a storage area corresponding to a key, and a correction unit 43 that corrects, if one of the keys is operated, the voltage generated as a result of an operation of the one of the keys by using voltages stored in storage areas corresponding to other keys. Thus, even if a plurality of keys are depressed at the same time, detection with high accuracy can be realized.

5 Claims, 9 Drawing Sheets

(56) References Cited

FOREIGN PATENT DOCUMENTS

| | | | |
|---|---|---|---|
| JP | 2011198041 | A | 10/2011 |
| JP | 2012182781 | A | 9/2012 |
| WO | 2009122744 | A1 | 10/2009 |

US 9,979,392 B2

CAPACITIVE KEYBOARD

CROSS-REFERENCE TO RELATED APPLICATIONS

This application is a 35 USC § 371 national stage entry of International Application No. PCT/JP2015/084082, filed Nov. 27, 2015, which claims the benefit of priority to Japanese Application No. 2014-264871, filed Dec. 26, 2014, both of which are incorporated by reference herein in their entireties.

TECHNICAL FIELD

The present invention relates to a capacitive keyboard including a plurality of capacitive keys arranged in a matrix.

BACKGROUND ART

As a keyboard used for a personal computer and the like, a capacitive keyboard including a plurality of capacitive keys has been proposed and put into practical use. A capacitive keyboard includes a plurality of drive lines and a plurality of sensing lines that intersect the drive lines, and capacitive keys are arranged at the respective intersections of the drive lines and the sensing lines. Upon any one of the plurality of keys being depressed, the capacitance between two electrodes of the key is increased, and accordingly, current flows from a corresponding one of the drive lines through the depressed key to a corresponding one of the sensing lines. By detecting the current, the depressed key can be recognized (see, for example, PTL 1).

Now, a capacitive keyboard of the related art will be described below with reference to FIGS. 10 and 11. FIG. 10 illustrates the arrangement configuration of the capacitive keyboard of the related art, and FIG. 11 is an equivalent circuit diagram of the capacitive keyboard of the related art. As illustrated in FIG. 10, in the capacitive keyboard of the related art, a plurality of drive lines M (M-1, M-2, M-3 . . . ) and a plurality of sensing lines N (N-1, N-2, N-3 . . . ) are arranged to intersect one another. Each of the drive lines M is connected to a drive circuit 101, and each of the sensing lines N is connected to a sensing circuit 102.

Keys 103 (103a, 103b, and the like) are arranged at the respective intersections of the drive lines M and the sensing lines N. Upon any one of the keys 103 being depressed, the capacitance at the intersection of a corresponding one of the drive lines M and a corresponding one of the sensing lines N can be changed. Specifically, upon any one of the keys 103 being depressed, the capacitance is increased. Thus, keys are expressed by symbols of variable capacitors in the drawings.

The drive circuit 101 alternatively applies an H-level voltage to each of the drive lines M over a fixed period. Accordingly, for example, upon the key 103a illustrated in FIG. 10 being depressed, if an H-level is set in the drive line M-4, current flows from the drive line M-4 through the sensing line N-5 to the sensing circuit 102. That is, current flows through a path indicated by arrows Y0 and Y1 in FIG. 10. Accordingly, while the drive line M-4 is set at the H-level by the drive circuit 101, on the basis of detection of the voltage of the sensing line N-5, the sensing circuit 102 can detect that the key 103a has been depressed.

However, if a key other than the key 103a is depressed as a result of erroneously or intentionally depressing a plurality of keys, for example, the sensing circuit 102 cannot detect the exact voltage in some cases. For example, while the key 103a is depressed, if the key 103b is further depressed, current that flows in the drive line M-4 is supplied through the sensing line N-5 to the sensing circuit 102 and through the drive line M-6 to the ground. That is, current flows through a path indicated by an arrow Y2 in FIG. 10.

This phenomenon will be described with reference to the equivalent circuit illustrated in FIG. 11. If only the key 103a is depressed, current that flows through a capacitor C101 flows via a resistor R2 to the ground. Thus, by measuring the voltage at a node P1 of the resistor R2, it is possible to detect that the key 103a has been depressed. At this time, if the key 103b is further depressed so that current flows through a capacitor C102, the voltage detected by the sensing circuit 102 is lower than the voltage detected during a normal operation. Accordingly, the voltage might not reach a threshold for determining whether or not the key has been depressed, and the detection might fail. If three or more keys are depressed at the same time, such detection failure may occur with a higher possibility.

Recently, there has been a demand for proposing a keyboard having a function of, in addition to detecting whether or not a key has been depressed, detecting the depressed amount of a key (stroke of a key). In addition, there is a demand for a keyboard to have a function that enables various input operations by depressing a number of keys at the same time. Although the technique disclosed in PTL 1 can detect whether or not a key has been depressed, it is difficult to detect the depressed amount of the key. In addition, if a plurality of keys are depressed at the same time, a problem arises in that the depressed amount of each key cannot be detected with high accuracy.

CITATION LIST

Patent Literature

PTL 1: Japanese Unexamined Patent Application Publication No. 62-144223

SUMMARY OF INVENTION

Technical Problem

As described above, the capacitive keyboard of the related art can detect whether or not a key has been depressed, but cannot detect the depressed amount thereof, and a demand for detecting the depressed amount of the key with high accuracy has been increased.

The present invention has been made in order to solve such a problem of the related art, and an object of the present invention is to provide a capacitive keyboard that can detect a key that has been depressed and the depressed amount thereof with high accuracy.

The object of the present invention is to further provide a capacitive keyboard that can detect, even if a plurality of keys are depressed, the depressed amounts of all of the keys at the same time.

Solution to Problem

To achieve the above object, the invention of this application includes a plurality of drive lines and a plurality of sensing lines that intersect the drive lines, the keyboard including: keys provided at intersections of the drive lines and the sensing lines, each of the keys including an operation component and an electrode unit including a pair of electrodes connected to a corresponding one of the drive lines and a corresponding one of the sensing lines, capacitance between the electrodes being changed in accordance with a depressed amount of the operation component; a drive circuit that is connected to each of the drive lines and that alternatively switches a voltage of each of the drive lines from a low level to a high level; a sensing circuit that is connected to each of the sensing lines and that selects one of the sensing lines to detect a voltage generated in the selected sensing line; and a control circuit that detects one of the keys that has been operated and an operation amount of the operated key. The control circuit includes a storage unit including storage areas corresponding to the keys, a storage control unit that acquires the voltage generated in the sensing line selected by the sensing circuit and that stores the acquired voltage in a corresponding one of the storage areas as a voltage corresponding to a key provided at an intersection of a drive line that is set at the high level and the selected sensing line, and a correction unit that corrects, if one of the keys is operated, a voltage generated as a result of an operation of the one of the keys by using voltages stored in storage areas corresponding to other keys.

Advantageous Effects of Invention

In the capacitive keyboard according to the present invention, if an operator depresses one of the keys, the voltage in accordance with the depressed amount of the key is generated in a sensing line, and the voltage is detected by a sensing circuit. Then, the detected voltage is stored in a storage area corresponding to the key, the area being set in a storage unit. In addition, as for each of the other keys, the voltage detected by the sensing circuit is stored in a corresponding storage area. If the voltage corresponding to one of the keys is detected, the detected voltage is corrected by using the voltages stored in storage areas corresponding to the other keys. Accordingly, it becomes possible to detect the key that has been depressed and the depressed amount thereof with high accuracy. In addition, if a plurality of keys have been depressed, the depressed amounts of all of the keys can be detected at the same time.

DESCRIPTION OF EMBODIMENTS

Figure 1:
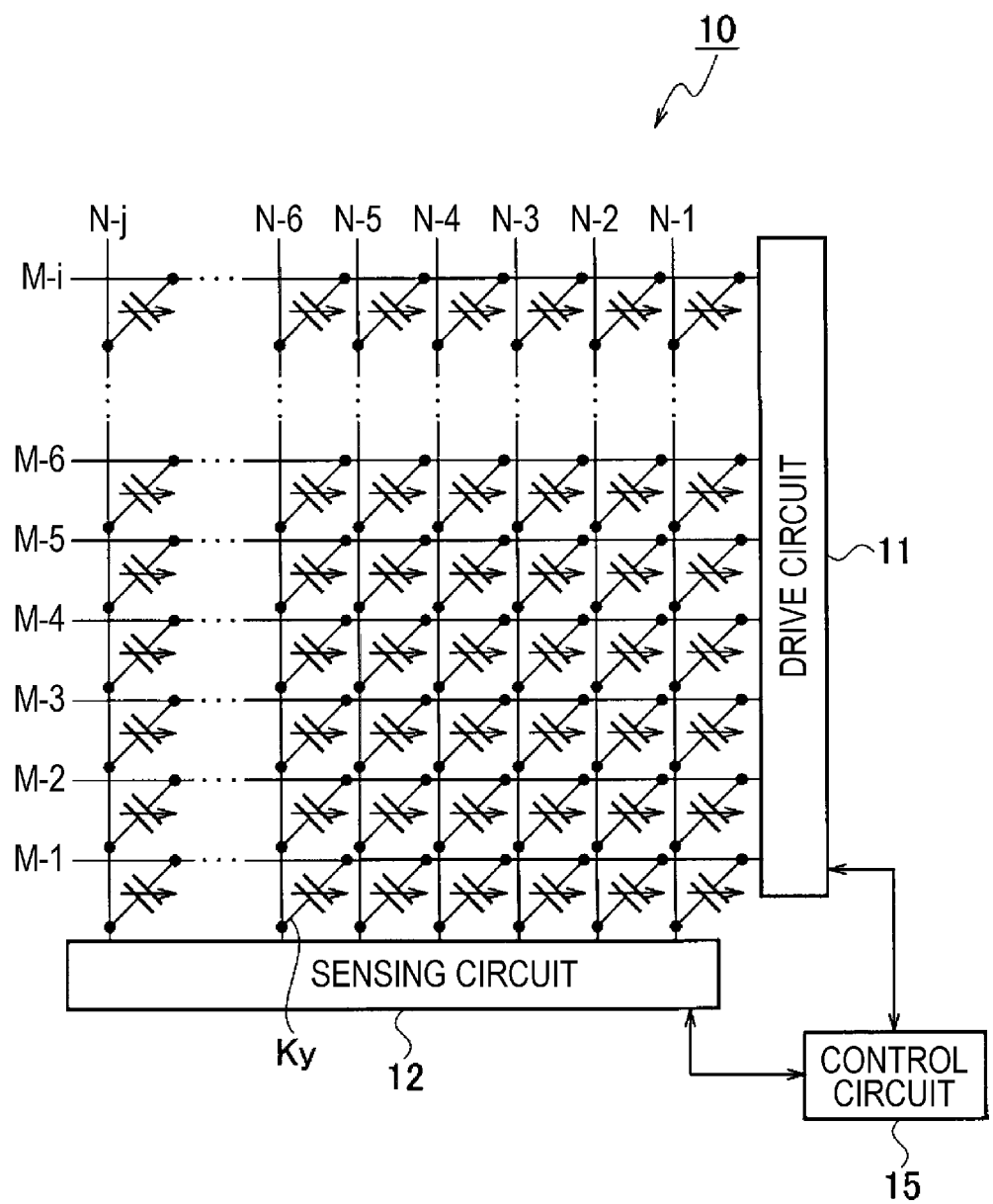
FIG. 1 is a circuit diagram of a capacitive keyboard according to an embodiment of the present invention.

Now, an embodiment of the present invention will be described below with reference to drawings. FIG. 1 schematically illustrates the configuration of a capacitive keyboard device according to the embodiment of the present invention. As illustrated in FIG. 1, in a capacitive keyboard 10 according to this embodiment, a plurality (for example, the number being i) of drive lines M (M-1, M-2, M-3, . . . , M-i) and a plurality (for example, the number being j) of sensing lines N (N-1, N-2, N-3, . . . , N-j) are arranged to intersect (cross) one another. Note that in the following description, unless indicating a specific drive line, the drive lines are denoted by symbol "M", and if indicating a specific drive line, the individual drive lines are denoted by a suffix such as "M-1". Similarly for the sensing lines, unless indicating a specific sensing line, the sensing lines are denoted by symbol "N", and if indicating a specific sensing line, the individual sensing lines are denoted by a suffix such as "N-1".

As illustrated in FIG. 1, the drive lines M are connected to a drive circuit 11, and the sensing lines N are connected to a sensing circuit 12. The drive circuit 11 and the sensing circuit 12 are connected to a control circuit 15, and the control circuit 15 controls driving of the drive circuit 11 and the sensing circuit 12.

The drive lines M and the sensing lines N are connected to one another at the respective intersections with keys Ky, and at a normal time (when keys Ky are not depressed), the lines M and N are not electrically continuous at the intersections. As will be described later, each of the keys Ky includes a variable capacitor. Thus, each of the keys Ky is expressed by a symbol of a variable capacitor.

Figure 2:
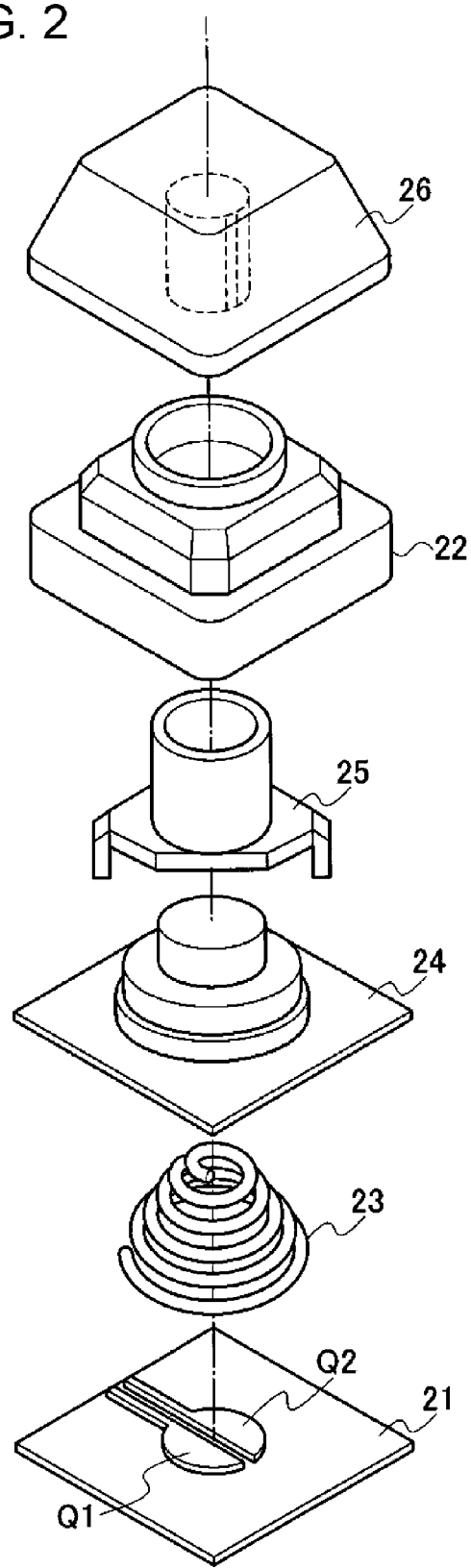
FIG. 2 is an exploded perspective view illustrating a detailed configuration of each key used for the capacitive keyboard according to the embodiment of the present invention.

As illustrated in FIG. 2, each of the keys Ky includes a substrate 21 having a pair of electrodes Q1 and Q2 (electrode unit) and a housing 22. Between the substrate 21 and the housing 22, a circular conical coil spring 23, a flexible rubber 24, and a plunger 25 are provided. Note that the electrodes Q1 and Q2 and the coil spring 23 are electrically insulated from one another with an insulating layer, which is not illustrated, and thereby forming a capacitor. Furthermore, a key top 26 (operation component) is provided above the housing 22. Upon the key top 26 being depressed by an operator, the coil spring 23 is energized, and thereby the capacitance between the electrodes Q1 and Q2 is changed. That is, each of the keys Ky is configured to cause the capacitance between the electrodes Q1 and Q2 to be increased in accordance with the depressed amount of the key top 26.

Note that in the following description, unless indicating a specific key, the plurality of keys Ky are denoted by symbol "Ky", and if indicating a specific key, the plurality of keys Ky are denoted by a drive line M number and a sensing line N number forming an intersection. For example, a key provided at the intersection of the drive line M-4 and the sensing line N-5 is denoted by symbol "Ky-45".

Figure 3:
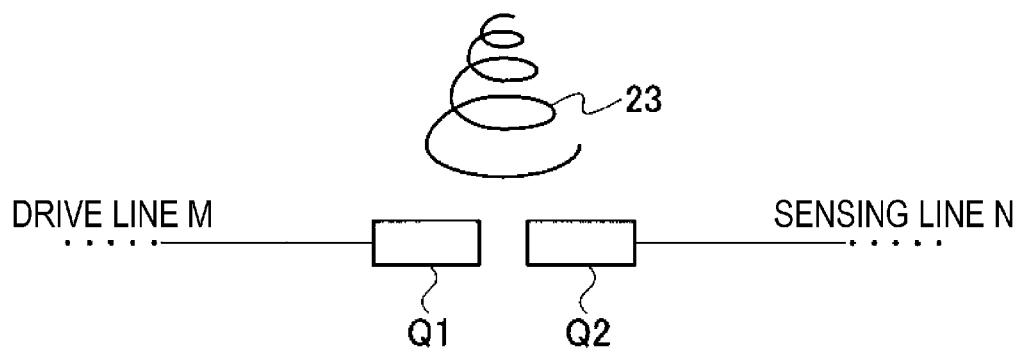
FIG. 3 schematically illustrates the relationship between two electrodes and a coil spring in the key used for the capacitive keyboard according to the embodiment of the present invention.

In addition, the electrode Q1, which is one of the two electrodes Q1 and Q2 provided in each of the above-described keys Ky, is connected to a drive line M, and the electrode Q2, which is the other, is connected to a sensing line N. Specifically, as schematically illustrated in FIG. 3, the electrode Q1 and the electrode Q2 are arranged to face each other with a fixed distance therebetween, the electrode Q1 is connected to the drive line M, and the electrode Q2 is connected to the sensing line N. The capacitance between the electrodes Q1 and Q2 is changed in accordance with the expansion and contraction status (i.e., the depressed amount of the key top 26 illustrated in FIG. 2) of the coil spring 23 provided between the two electrodes Q1 and Q2. Thus, current that flows from the electrode Q1 to the electrode Q2 is changed accordingly.

Now, referring to a block diagram illustrated in FIG. 4, details of the drive circuit 11, the sensing circuit 12, and the control circuit 15 will be described. The control circuit 15 includes a main control unit 41, a storage control unit 42, a correction unit 43, and a storage unit 44.

The main control unit 41 generally controls the control circuit 15 and outputs a variety of control signals to the drive circuit 11 and the sensing circuit 12. Specifically, the main control unit 41 outputs, to the drive circuit 11, a drive control signal for alternatively setting each of the drive lines M at the H-level. In addition, the main control unit 41 outputs, to the sensing circuit 12, a switch control signal for a multiplexer 31 (described later), a reset signal for a peak hold circuit 32 (described later), and a conversion start signal for an A/D conversion circuit 33 (described later).

The storage unit 44 includes a detected voltage storage area 45 and a corrected voltage storage area 46. Each of the detected voltage storage area 45 and the corrected voltage storage area 46 includes storage areas corresponding to the keys Ky. The detected voltage storage area 45 includes each storage area Cin(m,n) corresponding to an m-th drive line M and an n-th sensing line N and stores a voltage detected by the sensing circuit 12 as a voltage Vin(m,n) corresponding to each key Ky-mn. The corrected voltage storage area 46 includes each storage area Cout(m,n) corresponding to the m-th drive line M and the n-th sensing line N and stores a voltage corresponding to each key Ky-mn as a voltage Vout(m,n), the voltage having been corrected by the correction unit 43.

On the basis of a voltage generated in a drive line M that is set at the H-level and each of the sensing lines N, the storage control unit 42 acquires a voltage corresponding to a key Ky provided at each intersection and writes the acquired voltage in a storage area (the detected voltage storage area 45 and the corrected voltage storage area 46) corresponding to each key Ky. In addition, the storage control unit 42 performs control to read voltages stored in the storage areas.

On the basis of the voltage corresponding to one of the keys Ky detected by the sensing circuit 12 and the voltages corresponding to the other keys Ky stored in the detected voltage storage area 45, the correction unit 43 performs processing to correct the voltage corresponding to the one of the keys Ky and to store the corrected voltage in the corrected voltage storage area 46. For example, in a case of acquiring a voltage corresponding to the key Ky-45, on the basis of a voltage Vin(4,5) corresponding to the key Ky-45 detected by the sensing circuit 12 and the voltages corresponding to the other keys Ky, which are keys Ky-15, Ky-25, Ky-35, Ky-55, . . . , Ky-i5, stored in the detected voltage storage area 45, the correction unit 43 corrects the voltage Vin(4,5) corresponding to the key Ky-45.

On the other hand, on the basis of a control instruction (drive control signal) that is output from the control circuit 15, the drive circuit 11 illustrated in FIG. 1 performs control to alternatively apply an H-level (high level) voltage to each of the drive lines M (M-1 to M-i) over a fixed period. Specifically, the voltage of each of the drive lines M in the order of M-1, M-2, . . . , M-i, M-1 . . . is set at an H-level. The voltage of other drive lines M is set at an L-level (low level). Note that the order for applying the voltage is not limited to the above order, and the voltage may alternatively be set at an H-level in the drive lines M in any order in a fixed cycle. Note that as described above, each of the drive lines M is switched to be at an H-level and an L-level under control of the drive circuit 11, and thus, the switching is expressed by a switch SW and an arrow indicating a drive control signal in FIG. 4 for convenience sake. That is, if an instruction for setting a drive line M at an H-level is supplied on the basis of a drive control signal that is output from the control circuit 15, the switch SW is switched from "L" to "H", and an H-level voltage is applied to the keys Ky.

The sensing circuit 12 detects the voltage in accordance with current that flows in each of the sensing lines N. Now, details will be described below. As illustrated in FIG. 4, the sensing circuit 12 includes a series-connection circuit of resistors R1 and R2. A node P1 between the resistors R1 and R2 is connected to an output terminal (i.e., the electrode Q2 illustrated in FIG. 3) of a key Ky. A terminal of the resistor R1 is connected to a terminal for a power supply voltage VB, and a terminal of the resistor R2 is connected to the ground. This series-connection circuit is provided for each of the sensing lines N, and the node P1 is connected to the multiplexer 31. The resistors R1 and R2 have equal resistances. Thus, the voltage at the node P1 is the intermediate voltage between the power supply voltage VB that is supplied to the sensing circuit 12 and the ground voltage.

The multiplexer 31 alternatively switches the voltage (voltage generated across the resistor R2, i.e., voltage at the node P1) in accordance with current that flows in the sensing lines N via the keys Ky (Ky-11 to Ky-ij) in a fixed cycle by using an analog switch and outputs the voltage to the peak hold circuit 32.

The peak hold circuit 32 detects the peak value of the voltage generated at the node P1 and holds the detected peak value. Upon reception of a reset signal from the control circuit 15, the peak hold circuit 32 resets the held peak value.

The processing operations performed by the peak hold circuit 32 will be described with reference to the timing chart illustrated in FIG. 9. For example, as illustrated in FIG. 9(a), if the drive line M-4 is switched from an L-level to an H-level at time t0, upon the key Ky-45 being depressed with a small depressed amount, the capacitance in the key Ky-45 is higher than that at a normal time (when the key is not depressed). Accordingly, as illustrated in FIG. 9(b), current flows in the key Ky-45 at the time of switching from L to H (time t0) and at the time of switching from H to L (time t1), and the voltage at the node P1 is changed. Specifically, the voltage is increased at time t0 and is decreased at time t1. In addition, since the peak hold circuit 32 (see FIG. 4) holds this voltage (voltage V1), as illustrated in FIG. 9(c), the voltage peak value is held. That is, it is recognized that the key Ky-45 has been depressed with a small depressed amount. Then, upon reception of a reset signal at time t2, the held peak value is reset.

On the other hand, if the drive line M-4 is switched from an L-level to an H-level at time t3, upon the key Ky-45 being depressed with a large depressed amount, as illustrated in FIG. 9(b), current flows in the key Ky-45 at times t3 and t4, and the voltage at the node P1 is increased and decreased. In this case, since the depressed amount of the key is large, the capacitance between the electrodes Q1 and Q2 is higher than that at time t0. Accordingly, current that flows in the key Ky-45 is increased, and the voltage (voltage V2) generated at the node P1 is increased. That is, V2>V1 is satisfied. Then, the voltage peak value is held and output to the A/D conversion circuit 33.

Upon reception of a conversion start signal from the control circuit 15, the A/D conversion circuit 33 converts the voltage peak value that has been held by the peak hold circuit 32 into a digital value and outputs the digital data to the control circuit 15.

Figure 4:
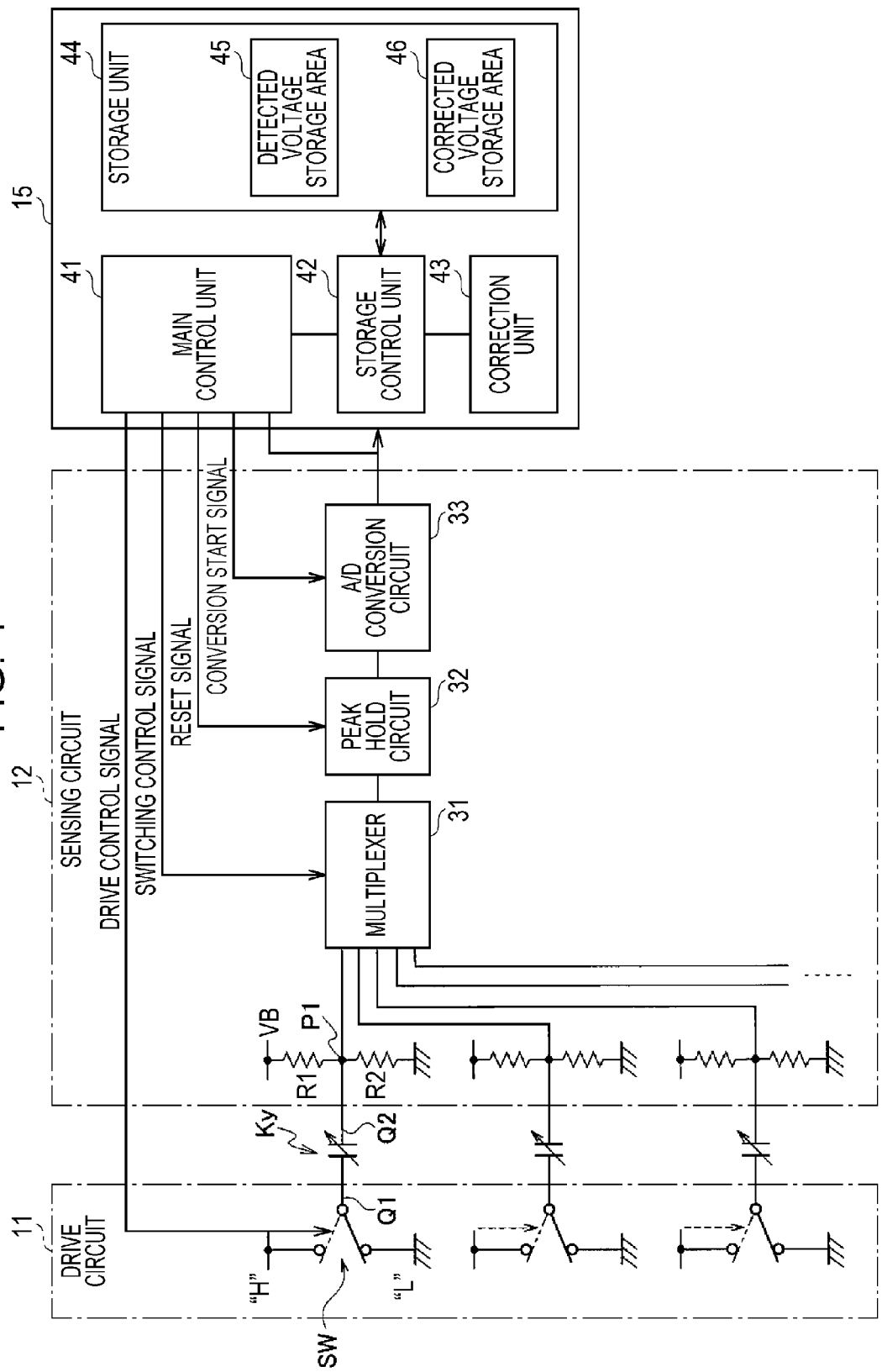
FIG. 4 is a block diagram illustrating a detailed configuration of a drive circuit, a sensing circuit, and a control circuit of the capacitive keyboard according to the embodiment of the present invention.

Accordingly, if the switch SW illustrated in FIG. 4 is switched from "off" to "on" (i.e., the voltage of a drive line M is switched from an L-level to an H-level), upon a key Ky being depressed by an operator, the voltage at the node P1 is increased. This voltage is supplied to the peak hold circuit 32 through the multiplexer 31, temporarily held by the peak hold circuit 32, and converted into a digital value by the A/D conversion circuit 33 to be output to the control circuit 15.

Then, as will be described later, by correcting the voltage that has been output from the A/D conversion circuit 33, the control circuit 15 detects the depressed amount of the depressed key Ky and, on the basis of the depressed amount, determines whether or not the key has been depressed. Furthermore, on the basis of temporal changes in the depressed amount, the depressing speed can be detected.

Such information (corrected information about depressing) about the depressing of the key Ky is converted into a key code by the main control unit 41 and then transmitted through an interface (not illustrated) to a host computer (not illustrated). That is, the control circuit 15 has a function of detecting, on the basis of the voltage detected by the sensing circuit 12, an operated key Ky and the operation amount thereof.

Figure 5:
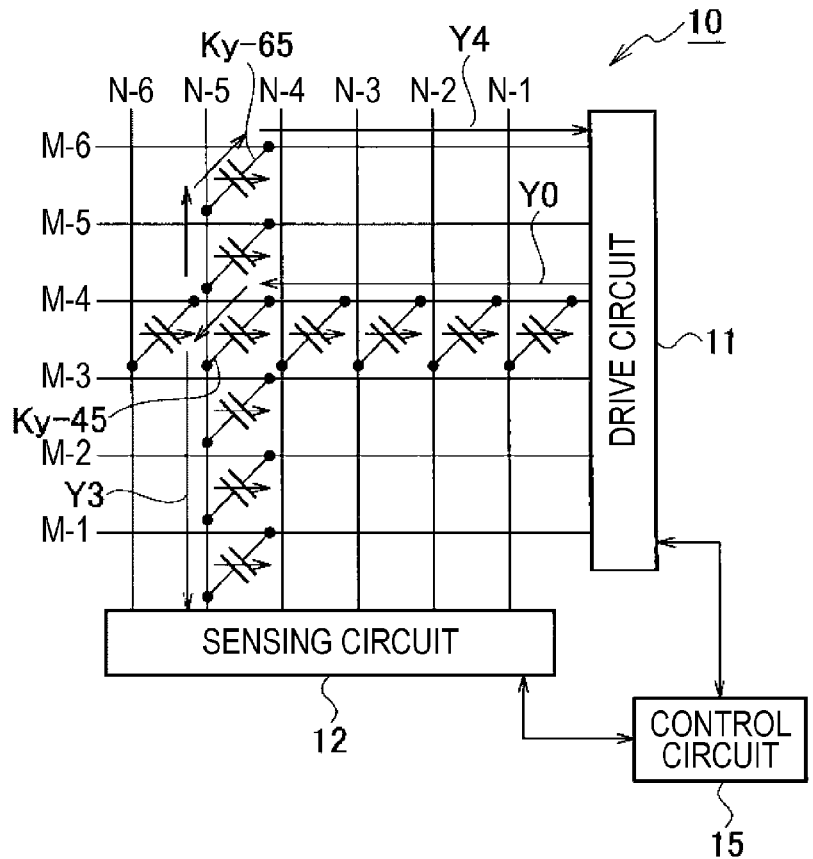
FIG. 5 illustrates current that flows when a key Ky-45 of the capacitive keyboard according to the embodiment of the present invention is depressed.
Figure 6:
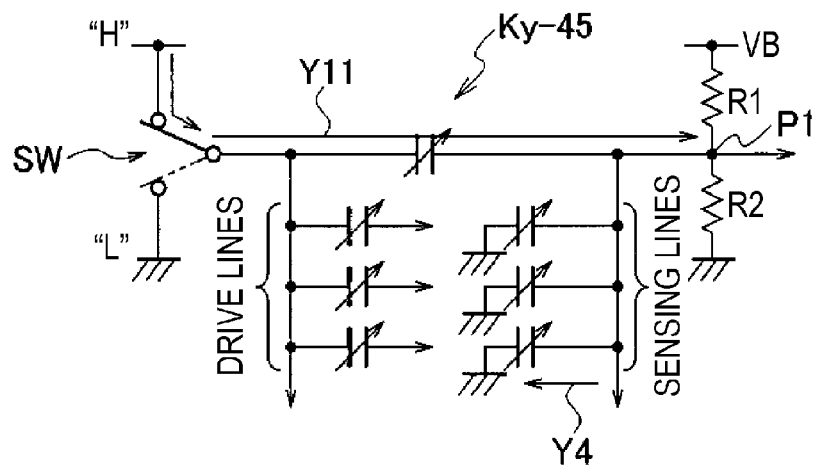
FIG. 6 is an equivalent circuit diagram illustrating current that flows when the key Ky-45 of the capacitive keyboard according to the embodiment of the present invention is depressed.

Next, operations of the thus configured capacitive keyboard 10 according to this embodiment will be described. First, the principle of detecting the operation amount of a key Ky will be described with reference to circuit diagrams illustrated in FIGS. 5 and 6. FIG. 5 illustrates current that flows when the key Ky-45 among the plurality of keys Ky is depressed, and FIG. 6 is an equivalent circuit diagram of this case. Note that FIG. 5 illustrates only some of the keys Ky connected to the drive line M-4 and the sensing line N-5, and the other keys Ky are not illustrated for simplicity.

As illustrated in FIG. 5, upon the key Ky-45 being depressed, the key top 26 illustrated in FIG. 2 is depressed, and thereby the coil spring 23 is energized. Accordingly, the capacitance between the electrodes Q1 and Q2 is increased (see FIG. 3). In addition, since the drive circuit 11 controls the voltage of each of the drive lines M to be sequentially switched from an L-level to an H-level, when the drive line M-4 is set at the H-level, current flows through the electrodes Q1 and Q2 of the key Ky-45. That is, current flows through a path of the drive line M-4, the key Ky-45, and the sensing line N-5 (a path indicated by arrows Y0 and Y3 in the drawing), and the voltage at the node P1 (see FIG. 6) is increased. This voltage is supplied through the multiplexer 31 illustrated in FIG. 4 to the peak hold circuit 32. Thus, the voltage peak value is held, and in addition, is converted into a multi-stage digital value by the A/D conversion circuit 33. Then, the voltage is output to the control circuit 15.

On the other hand, while the key Ky-45 is depressed, if a key Ky-65 connected to the same sensing line N-5 as the key Ky-45 is further depressed, as illustrated in FIG. 5, current flows through a path of the drive line M-4, the sensing line N-5, the key Ky-65, and the drive line M-6, that is, a path indicated by arrows Y0 and Y4. Thus, compared with the case where only the key Ky-45 is depressed, current that flows to the sensing circuit 12 through the path indicated by the arrow Y3 is decreased.

Furthermore, if another key (third key) connected to the same sensing line N-5 is depressed, current that flows through the path indicated by the arrow Y3 is more remarkably decreased. Accordingly, as illustrated in a waveform diagram in FIG. 7, if only the key Ky-45 is depressed in the one sensing line N-5, the voltage is changed as indicated by a curve q1, whereas if the other key Ky-65 is depressed at the same time, the voltage is decreased as indicated by a curve q2. Accordingly, with the two keys Ky being depressed at the same time, the peak value of the voltage detected by the sensing circuit 12 is changed from v1 to v2.

Figure 7:
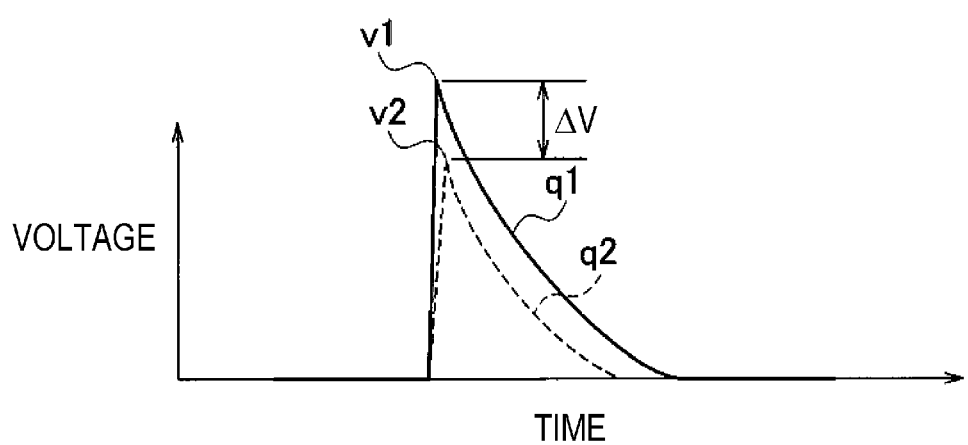
FIG. 7 illustrates waveforms representing changes in a peak voltage when only one of keys of the capacitive keyboard according to the embodiment of the present invention is depressed and when two keys are depressed at the same time.

In this embodiment, while one of the keys Ky is depressed, if another key Ky is further depressed, the voltage decreased as a result of the other key being depressed is corrected. Thus, the detection accuracy is prevented from being decreased by a plurality of keys Ky (typically, keys Ky connected to the same sensing line N) being depressed at the same time. Specifically, a voltage corresponding to $\Delta v$, which is the difference between the peak voltages v1 and v2 illustrated in FIG. 7, is calculated and added to the voltage detected by the sensing circuit 12, thereby correcting the detected voltage value.

Figure 8:
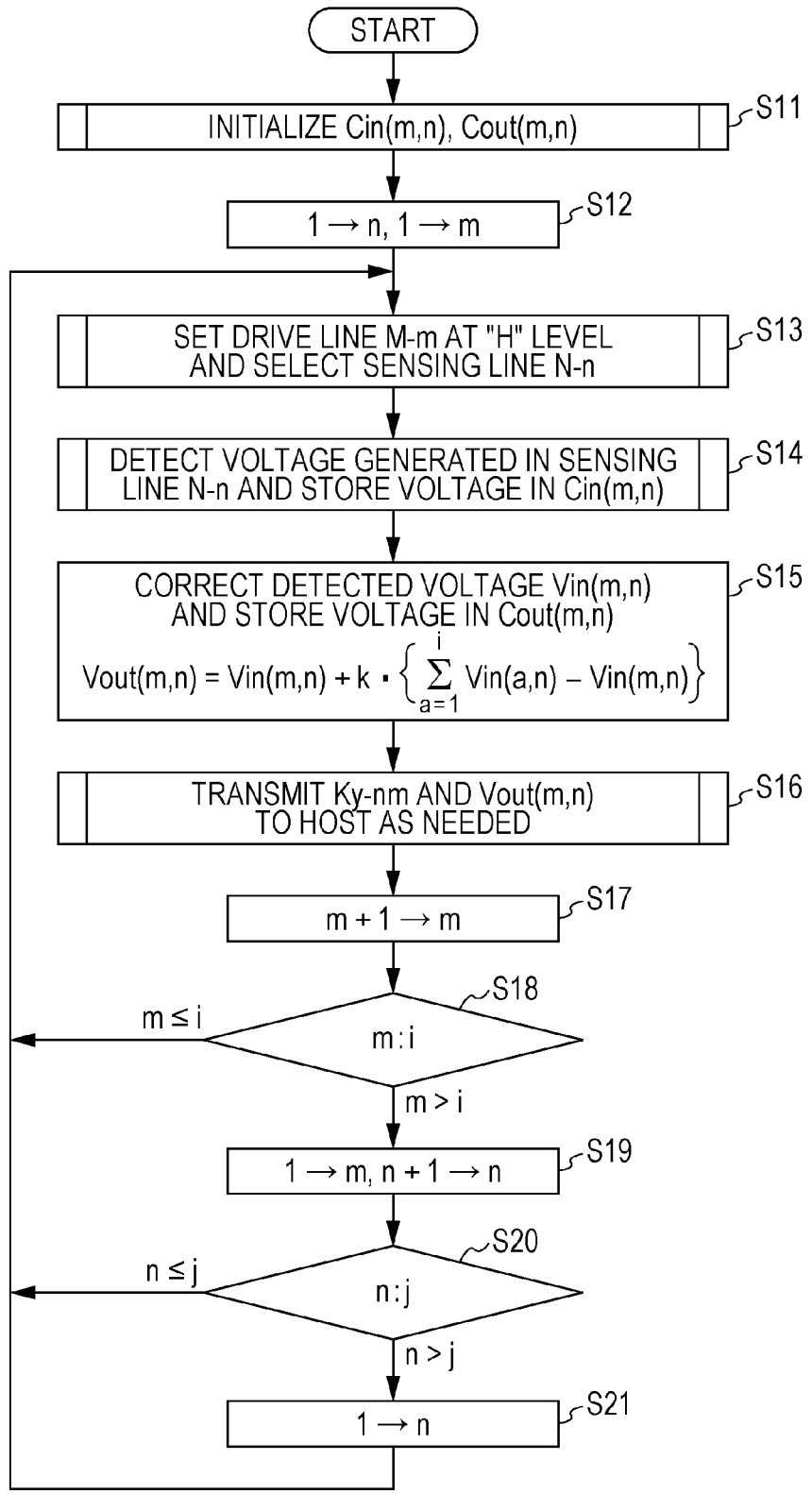
FIG. 8 is a flowchart illustrating a processing procedure of the capacitive keyboard according to the embodiment of the present invention.

A specific processing procedure will be described below with reference to a flowchart illustrated in FIG. 8. The processing illustrated in FIG. 8 is performed by the main control unit 41 illustrated in FIG. 4 in a predetermined cycle.

First, in step S11, the main control unit 41 initializes each storage area Cin(m,n) that corresponds to a key Ky and that is set in the detected voltage storage area 45, and each storage area Cout(m,n) that corresponds to the key Ky and that is set in the corrected voltage storage area 46. Here, "m" and "n" represent a drive line M number and a sensing line N number, respectively, where m is "1 to i" (i corresponds to the number of the drive lines M) and n is "1 to j" (j corresponds to the number of the sensing lines N). For example, Cin(4,5) indicates an area that stores the detected value of the voltage generated by depressing the "key Ky-45" and that is set in the detected voltage storage area 45.

In step S12, the main control unit 41 sets n=1 and m=1. In step S13, the main control unit 41 outputs, to the drive circuit 11, a control signal for applying an H-level voltage to a drive line M-m and outputs, to the multiplexer 31, a control signal for selecting a sensing line N-n. Thus, the drive line M-m is set at the H-level, and the multiplexer 31 selects the sensing line N-n.

In step S14, the main control unit 41 detects the voltage Vin(m,n) generated in the sensing line N-n of the key Ky-mn and stores the detected voltage in the storage area Cin(m,n). Since n=1 and m=1 are initially set, a voltage Vin(1,1) generated in a sensing line N-1 of a key Ky-11 is detected and is stored in a storage area Cin(1,1).

In step S15, the main control unit 41 calculates the corrected voltage Vout(m,n) by correcting the voltage Vin(m,n) stored in the storage area Cin(m,n) and stores the corrected voltage Vout(m,n) in the storage area Cout(m,n) that is set in the corrected voltage storage area 46. This correction is performed in accordance with Expression 1 below.

$$\text{Vout}(m, n) = \text{Vin}(m, n) + k \cdot \left\{ \sum_{a=1}^{i} \text{Vin}(a, n) - \text{Vin}(m, n) \right\} \quad \text{[Math 1]}$$

where 0<k<1.

Note that the above Expression 1 can also be represented by the following Expression 2 as a reference.

$$\text{Vout}(m,n) = \text{Vin}(m,n) + k\{\text{Vin}(1,n) + \text{Vin}(2,n) + \ldots + \text{Vin}(m-1,n) + \text{Vin}(m+1,n) + \ldots + \text{Vin}(j-1,n) + \text{Vin}(j,n)\} \quad \text{[Math 2]}$$

In the above Expression 1, for example, the sum of voltages Vin(m, 1) (except for Vin(1,1)) stored in storage areas Cin(m, 1) of keys Ky-m1 connected to the same sensing line N-1 as the key Ky-11 is multiplied by a constant k, and the resultant value (the voltage corresponding to Δv illustrated in FIG. 7) is added to the voltage Vin(1,1) detected in the sensing line N-1 of the key Ky-11, thereby calculating the corrected voltage. Then, a corrected voltage Vout(1,1) obtained by the calculation is stored in a storage area Cout(1,1). Note that each storage area Cin(m,n) is initially reset in step S11, and thus, zero is set in the storage areas Cin(m,n) other than the storage area Cin(1,1). However, as will be described later, by repeating this processing, voltages detected for corresponding keys Ky are stored in the respective storage areas Cin(m,n). Thus, by using these voltages, Expression 1 can be calculated.

In step S16, the main control unit 41 transmits information of the keys Ky-mn and information of the corrected voltages Vout(m,n) stored in the storage areas Cout(m,n) to a host computer (not illustrated) as needed.

In step S17, the main control unit 41 increments m so that "m=m+1" is set.

In step S18, the main control unit 41 compares m with i (the number of the drive lines M). If m≤i is satisfied, the process returns to step S13. If m>i is satisfied, the process proceeds to step S19.

In step S19, the main control unit 41 sets m=1 and increments n so that "n=n+1" is set. That is, upon completion of measuring the detected voltages of keys Ky-11 to Ky-i1 that are present at the intersections of the first sensing line N-1 and the first to the i-th drive lines M, the process proceeds to measuring the detected voltages in the second sensing line N-2.

In step S20, the main control unit 41 compares n with j (the number of the sensing lines N). If n≤j is satisfied, the process returns to step S13. If n>j satisfied, the process proceeds to step S21.

In step S21, the main control unit 41 sets n=1, and the process returns to step S13.

Then, by repeating step S13 to S21, the voltages Vin(m,n) detected for the keys Ky-mn are stored in the respective storage areas Cin(m,n) that are set in the detected voltage storage area 45, and the corrected voltages Vout(m,n) corresponding to the keys Ky-mn are stored in the respective storage areas Cout(m,n) that are set in the corrected voltage storage area 46.

Next, the above-described step S15 will be described in more detail by taking, as an example, the case where two keys Ky connected to the same sensing line N are depressed at the same time, specifically, as illustrated in FIG. 5, the case where the key Ky-45 and the key Ky-65 connected to the sensing line N-5 are depressed at the same time.

Upon the drive line M-4 being set at the "H" level under control of the drive circuit 11, as described above, current flows through the path indicated by the arrows Y0 and Y3. Accordingly, as a result of the key Ky-45 being depressed, a voltage is generated in the node P1 in the equivalent circuit illustrated in FIG. 6. At this time, since the key Ky-65 is further depressed, current flows through the path indicated by the arrow Y4, and the voltage generated at a node P is lower than that obtained when only the key Ky-45 is depressed. That is, as indicated by the curve q2 in FIG. 7, voltage characteristics are degraded, and the peak voltage is changed by Δv from the original voltage (the voltage obtained when only the key Ky-45 is depressed).

In step S15 in FIG. 8, correction is performed in accordance with the above-described Expression 1. Specifically, since the key Ky-65 is further depressed, a voltage Vin(6,5) stored in a storage area Cin(6,5) corresponding to the key Ky-65 is read, and the value obtained by multiplying the voltage Vin(6,5) by the constant k (0<k<1) is added to the voltage Vin(4,5) stored in the storage area Cin(4,5). Then, the corrected voltage Vout(4,5), which is the result of the addition, is stored in a storage area Cout(4,5). At this time, the constant k is set to an appropriate value by an initial setting. Thus, the above-described Expression 1 becomes the following Expression 3.

$$\text{Vout}(4,5) = \text{Vin}(4,5) + k \cdot \text{Vin}(6,5) \quad \text{[Math 3]}$$

"k·Vin(6,5)", which is the second term in the right side of Expression 3, corresponds to the voltage difference Δv illustrated in FIG. 7. Accordingly, by calculating Expression 3, an error in the detected voltage as a result of the key Ky-65 being further depressed can be corrected.

Through the above processing, the control circuit 15 can recognize that the key Ky-45 is depressed and the depressed amount thereof. Specifically, as illustrated in FIG. 9, it is possible to recognize, separately, the case where the key Ky-45 is depressed with a small depressed amount and the case where the key Ky-45 is depressed with a large depressed amount.

Figure 9:
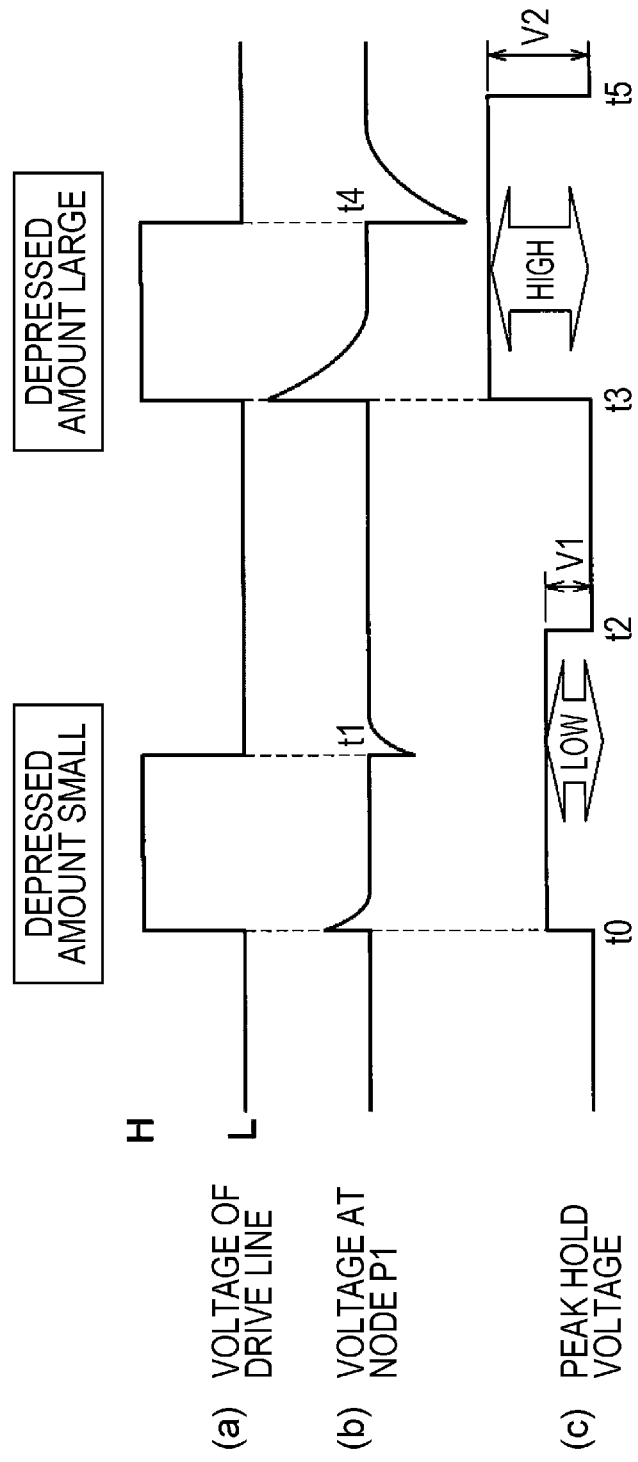
FIG. 9 is a timing chart illustrating changes in each signal when the depressed amount of a desired key of the capacitive keyboard according to the embodiment of the present invention is small and large.
Figure 10:
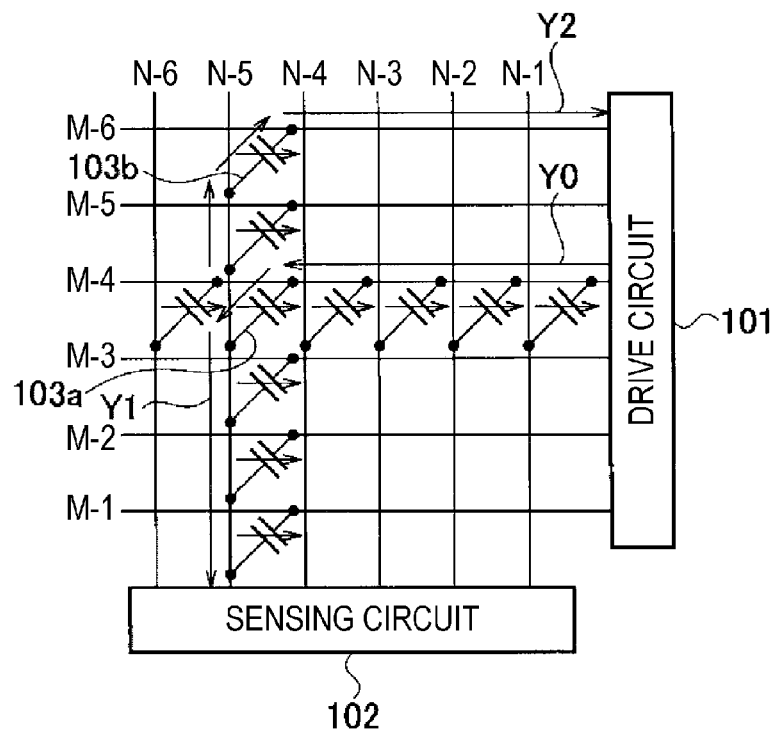
FIG. 10 is a circuit diagram of a capacitive keyboard of the related art.
Figure 11:
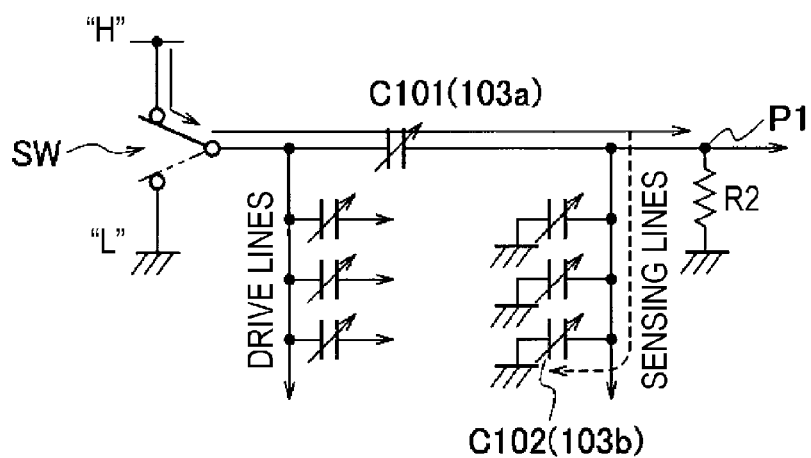
FIG. 11 is an equivalent circuit diagram of the capacitive keyboard of the related art.

Note that although FIG. 9 illustrates the case of two stages: when the depressed amount is small and large, the capacitance between the electrodes Q1 and Q2 is continuously changed in accordance with the depressed amount of a key Ky, and accordingly, detection can be performed in a plurality of ways in accordance with the changed amount. For example, if the depressed amount of a key Ky is divided into five stages, and if the voltage value is detected in five stages on the basis of the voltage generated at the node P1, the depressed amount of the key Ky can be recognized in five stages (multi-stage digital value).

In the above manner, by sequentially applying an H-level voltage to each of the drive lines M and sequentially switching each of the sensing lines N by using the multiplexer 31, it is possible to detect whether or not each of the keys Ky has been depressed, the depressed amount thereof, and the depressing speed. Furthermore, information about all of the keys Ky can be transmitted to a host computer (not illustrated).

Accordingly, when the desired key Ky-45 is depressed, even if the unexpected key Ky-65 is further erroneously depressed or intentionally depressed, it is possible to detect that the key Ky-45 has been depressed and the depressed amount thereof with high accuracy.

In the above manner, in the capacitive keyboard 10 according to this embodiment, the voltages Vin(m,n) generated in the sensing line N-n upon the keys Ky-mn being depressed is stored in the storage areas Cin(m,n) that are set in the detected voltage storage area 45 of the storage unit 44. Then, if, for example, the key Ky-45 is depressed as one of the keys, the voltage generated in the sensing line N-5 of the key Ky-45 is corrected by using the voltages generated in the sensing line N of the other keys Ky. Thus, the depressed key Ky, the depressed amount thereof, and the depressing speed can be detected with high accuracy. Accordingly, it becomes possible to input an instruction with fine movement or the like by using an application program based on the depressed amount and the depressing speed of the key Ky, and thereby a new input device can be provided in addition to the simple depressing and non-depressing function of a keyboard of the related art. For example, it becomes possible to apply this technology to new game software or the like so as to input an instruction about a detailed operation command through the keyboard of the present invention.

In addition, if the voltage generated in the sensing line N-5 of the key Ky-45 is corrected by using voltages generated in the sensing line N-5 of keys Ky-m5 (except for the key Ky-45), as the other keys Ky, connected to the same sensing line N-5 as the key Ky-45, the accuracy for detecting the depressed amount can be increased.

Furthermore, since the resistances of the two resistors R1 and R2 illustrated in FIG. 4 are equal to each other and the power supply voltage VB is divided to generate the voltage at the node P1, the voltage generated by current that is supplied from the sensing line N can be stabilized. Accordingly, it becomes possible to stably detect the information about the depressing of the key Ky.

Although the capacitive keyboard of the present invention has been described above on the basis of the illustrated embodiment, the present invention is not limited to the above embodiment, and the configuration of each unit can be replaced by a given configuration having the same or similar functions.

For example, although the above-described embodiment has illustrated a configuration in which the keys Ky are arranged at the respective intersections of the drive lines M and the sensing lines N, the present invention is not limited to this configuration, and keys may be absent at some of the intersections. In addition, the number of the drive lines M may be equal to the number of the sensing lines N. That is, i=j may be satisfied.

Furthermore, although the above-described embodiment has illustrated an example in which the resistances of the two resistors R1 and R2 provided in the sensing circuit 12 are equal to each other, the present invention is not limited to this example, and different resistances may be used.

INDUSTRIAL APPLICABILITY

According to the present invention, it is possible to provide a capacitive keyboard that can detect a key that has been depressed and the depressed amount thereof with high accuracy.

REFERENCE SIGNS LIST

10 capacitive keyboard
11 drive circuit
12 sensing circuit
15 control circuit
21 substrate
22 housing
23 coil spring
24 rubber
25 plunger
26 key top
31 multiplexer
32 peak hold circuit
33 A/D conversion circuit
41 main control unit
42 storage control unit
43 correction unit
44 storage unit
45 detected voltage storage area
46 corrected voltage storage area
Q1, Q2 electrode
R1 resistor
R2 resistor
SW switch

The invention claimed is:
1. A capacitive keyboard comprising a plurality of drive lines and a plurality of sensing lines that intersect the drive lines, the capacity keyboard comprising:
   keys provided at intersections of the drive lines and the sensing lines, each of the keys including an operation component and an electrode unit including a pair of electrodes connected to a corresponding one of the drive lines and a corresponding one of the sensing lines, wherein capacitance between the pair of electrodes is changed in accordance with a depressed amount of the operation component;
   a drive circuit that is connected to each of the drive lines and that alternatively switches a voltage of each of the drive lines from a low level to a high level;
   a sensing circuit that is connected to each of the sensing lines and that selects one of the sensing lines to detect a voltage generated in the selected sensing line; and
   a control circuit that detects one of the keys that has been operated and an operation amount of the operated key, wherein the control circuit includes a storage unit including storage areas corresponding to the keys, a storage control unit that acquires the voltage generated in the sensing line selected by the sensing circuit and that stores the acquired voltage in a corresponding one of the storage areas as a voltage corresponding to a key provided at an intersection of a drive line that is set at the high level and the selected sensing line, and a correction unit that corrects, if one of the keys is operated, a voltage generated as a result of an operation of the one of the keys by using voltages stored in storage areas corresponding to other keys.

2. The capacitive keyboard according to claim 1, wherein, if the one of the keys is operated, the correction unit corrects the voltage generated as a result of the operation of the one of the keys by using the voltages stored in the storage areas corresponding to the other keys connected to a same sensing line as the one of the keys.

3. The capacitive keyboard according to claim 2, wherein, if the voltage of one of the keys stored in the detected voltage storage area is Vin(m,n) (where m is a drive line number and n is a sensing line number), the correction unit calculates a corrected voltage Vout(m,n) according to the following Expression $$\text{Vout}(m, n) = \text{Vin}(m, n) + k \cdot \left\{ \sum_{a=1}^{i} \text{Vin}(a, n) - \text{Vin}(m, n) \right\}.$$

4. The capacitive keyboard according to claim 1, wherein the storage areas include a detected voltage storage area that stores a voltage generated in each of the sensing lines and a corrected voltage storage area that stores a corrected voltage obtained by correction performed by the correction unit.

5. The capacitive keyboard according to claim 1, wherein the voltage of each of the sensing lines is held at an intermediate value between a power supply voltage to be supplied to the sensing circuit and a ground voltage.

\* \* \* \* \*